(12) United States Patent
Maehata

(10) Patent No.: US 9,203,433 B2
(45) Date of Patent: *Dec. 1, 2015

(54) ERROR CORRECTING DECODING APPARATUS FOR DECODING LOW-DENSITY PARITY-CHECK CODES

(71) Applicant: SUMITOMO ELECTRIC INDUSTRIES, LTD., Osaka (JP)

(72) Inventor: Takashi Maehata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/502,294

(22) Filed: Sep. 30, 2014

(65) Prior Publication Data

US 2015/0019931 A1    Jan. 15, 2015

Related U.S. Application Data

(63) Continuation of application No. 14/028,241, filed on Sep. 16, 2013, which is a continuation of application No. 13/157,042, filed on Jun. 9, 2011, now Pat. No. 8,572,453.

(51) Int. Cl.
*H03M 13/00* (2006.01)
*H03M 13/11* (2006.01)
*H04L 1/00* (2006.01)

(52) U.S. Cl.
CPC ...... *H03M 13/1145* (2013.01); *H03M 13/1111* (2013.01); *H03M 13/1134* (2013.01); *H03M 13/1177* (2013.01); *H03M 13/6563* (2013.01); *H04L 1/0057* (2013.01)

(58) Field of Classification Search
CPC .............. G06F 11/00; H03M 13/1111; H03M 13/1134; H03M 13/6563; H03M 13/37; H03M 9/00; H03M 13/255; H03M 13/6561; H04L 1/004
See application file for complete search history.

(56) References Cited

U.S. PATENT DOCUMENTS

| | | | |
|---|---|---|---|
| 4,965,883 A * | 10/1990 | Kirby | 714/49 |
| 5,537,429 A * | 7/1996 | Inoue | 714/755 |
| 6,574,290 B1 | 6/2003 | Yoshinaka | |
| 7,058,118 B1 * | 6/2006 | Horii et al. | 375/149 |

(Continued)

FOREIGN PATENT DOCUMENTS

| JP | 03-16321 A | 1/1991 |
|---|---|---|
| JP | 5-159477 A | 6/1993 |

(Continued)

OTHER PUBLICATIONS

Office Action issued in Patent Application No. JP 2011-250755 with Date of mailing Aug. 20, 2013.

(Continued)

*Primary Examiner* — Guerrier Merant
(74) *Attorney, Agent, or Firm* — McDermott Will & Emery LLP

(57) ABSTRACT

A decoder 5 applies decode processing to N input data in parallel to generate K decode data. An S/P converter 6 outputs N input data applied in series to decoder 5 through first lines L1-L64 dividedly over several times. A P/S converter 7 receives through second lines R1-R60 the K decode data from decoder 5 dividedly over several times to output in series the K decoded data to an external source.

5 Claims, 10 Drawing Sheets

(56) References Cited

U.S. PATENT DOCUMENTS

| | | | |
|---|---|---|---|
| 7,966,544 B2* | 6/2011 | Paumier et al. | 714/755 |
| 8,271,862 B2* | 9/2012 | Kobayashi | 714/794 |
| 2002/0023247 A1* | 2/2002 | Akiyama et al. | 714/758 |
| 2003/0086375 A1* | 5/2003 | Yano et al. | 370/235 |
| 2007/0253503 A1* | 11/2007 | Kim et al. | 375/265 |
| 2007/0283209 A1* | 12/2007 | Paumier et al. | 714/752 |
| 2009/0034649 A1* | 2/2009 | Litsyn et al. | 375/295 |
| 2009/0245435 A1 | 10/2009 | Challa et al. | |
| 2010/0211857 A1* | 8/2010 | Kobayashi | 714/784 |
| 2012/0023383 A1 | 1/2012 | Maehata | |

FOREIGN PATENT DOCUMENTS

| | | | |
|---|---|---|---|
| JP | 08-124321 A | 5/1996 | |
| JP | 08-125640 A | 5/1996 | |
| JP | 08-279799 A | 10/1996 | |
| JP | 11-232788 A | 8/1999 | |
| JP | 2000-149436 A | 5/2000 | |
| JP | 2005-354310 A | 12/2005 | |
| JP | 2007-323515 A | 12/2007 | |
| JP | 2007-335992 A | 12/2007 | |
| JP | 4867980 B2 | 2/2012 | |

OTHER PUBLICATIONS

Chung, Sae-Young, et al., "On the Design of Low-Density Parity-Check Codes within 0.0045 dB of the Shannon Limit", IEEE Communications Letters, Feb. 2001, pp. 58-60, vol. 5 No. 2.

Yeo, Engling, "VLSI Architectures for Iterative Decoders in Magnetic Recording Channels", Mar. 2001, IEEE Transactions on Magnetics, Mar. 2001, pp. 748-755, vol. 37 No. 2.

Wadayama, Tadashi, "Introduction to Low Density Parity Check Codes and the Sum-Product Algorithm", w/ English translation of abstract thereof, Technical Report of IEICE, Dec. 2001, pp. 1-8, MR2001-83.

Japanese Notice of Grounds of Rejection, w/ English translation thereof, issued in Japanese Patent Application No. 2008-301110, dated Jan. 18, 2011.

Japanese Notice of Grounds of Rejection, w/ English translation thereof, issued in Japanese Patent Application No. 2008-301110, dated May 24, 2011.

Non-Final Office Action issued in U.S. Appl. No. 13/157,042 with Date of mailing Mar. 19, 2013.

Notice of Allowance issued in U.S. Appl. No. 13/157,042 with Dated of mailing Jun. 17, 2013.

Japanese Office Action issued in Japanese Application No. 2014-038530 dated Feb. 3, 2015, with English translation.

* cited by examiner

FIG.2

| TRANSMISSION DATA | MODULATOR OUTPUT | BRIGHTNESS MODULATION | LIGHT RECEPTION LEVEL | | DEMODULATOR OUTPUT |
|---|---|---|---|---|---|
| 0 | 1 | STRONG LIGHT | 7: | VERY STRONG LIGHT | 3 |
| | | | 6: | RELATIVELY STRONG LIGHT | 2 |
| | | | 5: | STRONG LIGHT | 1 |
| | | | 4: | MODERATE LIGHT | 0 |
| 1 | -1 | WEAK LIGHT | 3: | LIGHT RELATIVELY WEAKER THAN MODERATE LIGHT | -1 |
| | | | 2: | WEAK LIGHT | -2 |
| | | | 1: | RELATIVELY WEAK LIGHT | -3 |
| | | | 0: | VERY WEAK LIGHT | -4 |

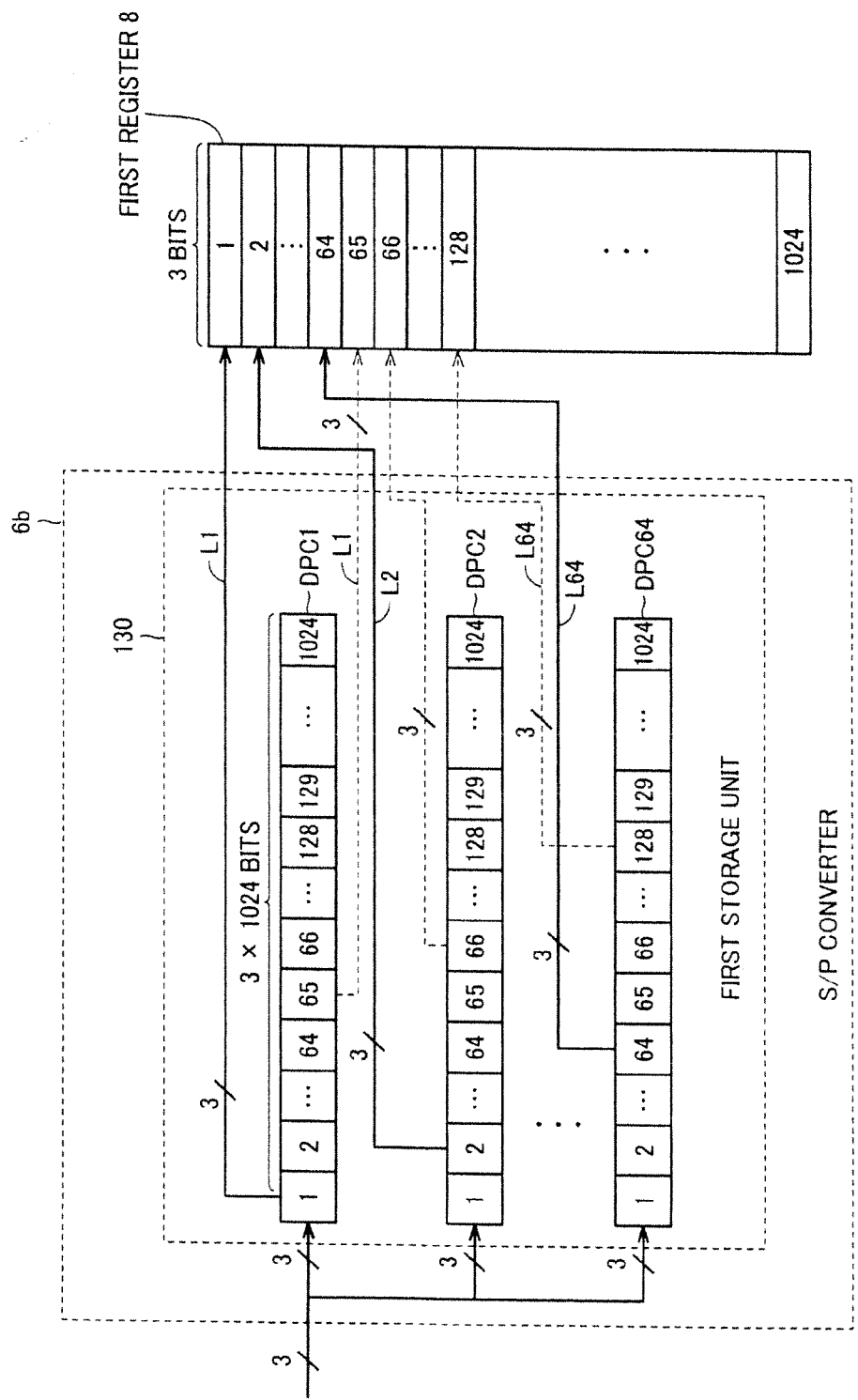

ERROR CORRECTING DECODING APPARATUS FOR DECODING LOW-DENSITY PARITY-CHECK CODES

RELATED APPLICATIONS

This application is the continuation of U.S. patent application Ser. No. 14/028,241, filed Sep. 16, 2013, which is a continuation of U.S. patent application Ser. No. 13/157,042, filed on Jun. 9, 2011, now U.S. Pat. No. 8,572,453, which issued on Oct. 29, 2013, the disclosures of which are incorporated by reference herein.

BACKGROUND OF THE INVENTION

1. Field of the Invention

The present invention relates to error correcting decoding apparatuses, particularly, an error correcting decoding apparatus for decoding low-density parity-check codes.

2. Description of the Background Art

In creating a signal communication system, high speed communication, low power consumption, high communication quality (low bit error rate) and the like are required. The error correcting technique of detecting and correcting an error in reception codes is widely employed as one approach satisfying the aforementioned requirements in wireless, wired, and recording systems or the like.

In recent years, low-density parity-check (LDPC) codes and the sum-product decoding method are attracting attention as one approach in association with such error correcting technique. The decoding operation utilizing such LDPC codes is discussed in Non-Patent Document 1 of Chung et al. (S. Y. Chung et al., "On the Design of Low-Density Parity-Check Codes within 0.0045 dB of the Shannon Limit" IEEE COMMUNICATIONS LETTERS, VOL. 5, No. 2, February 2001, pp. 58-60). This Non-Patent Document 1 teaches that decoding characteristics within 0.04 dB of the Shannon limit in the white Gaussian channel can be achieved utilizing irregular LDPC codes at the code rate of ½. Irregular LDPC codes refer to codes having a row weight (the number of 1 s in a row) and a column weight (the number of 1 s in a column) in a parity check matrix that are not constant. LDPC codes having a constant row weight and column weight in each row and each column are referred to as regular LDPC codes.

Although Non-Patent Document 1 shows mathematical algorithm of decoding LDPC codes according to the sum-product decoding method, there is no teaching of a specific circuit configuration to carry out the massive calculation.

Non-Patent Document 2 of Yeo et al. (E. Yeo et al., "VLSI Architectures for Iterative Decoders in Magnetic Recording Channels" IEEE Trans. Magnetics, Vol. 37, No. 2, March 2001, pp. 748-755) provides a study on the circuit configuration of a decoding apparatus for LDPC codes. Non-Patent Document 2 teaches MAP (maximum a posteriori probability) algorithm defined on the trellis, i.e. BCJR algorithm, as the posteriori probability of the information symbol based on the reception series. The iteration in the forward direction and backward direction in the trellis is calculated for each state, and the posteriori probability is obtained based on the iteration values in the forward direction and backward direction. This calculation is carried out using add-compare-select-add units. A circuit is configured to generate a check matrix according to the sum-product decoding method for LDPC codes, and an estimate value is calculated using values from different check nodes.

Non-Patent Document 3 (Tadashi Wadayama, "Low-Density Parity-Check Codes and Decoding Method Thereof", TECHNICAL REPORT OF IEICE, MR2001-83, December, 2001) illustrates LDPC codes and the sum-product decoding method, as well as the min-sum decoding method in the log domain. Non-Patent Document 3 shows that processing according to the f function of Gallager can be implemented by just the four basic operations of addition, minimize, positive/negative determination and positive/negative sign.

The aforementioned Non-Patent Document 2 and Non-Patent Document 3 disclose, in order to generate a parity check matrix to calculate a primary estimate word, a process including the steps of updating an external value log ratio $\alpha$ using the f function of Gallager according to the sum-product method, and then calculating the priori value log ratio $\beta$ of the symbol based on the external value log ratio. Therefore, calculation of the Gallager function is time consuming and the circuit scale becomes larger.

The aforementioned Non-Patent Document 3 shows that the circuit configuration in implementation can be simplified in a short period of time by employing the min-sum decoding method that is a simplified version of the sum-product decoding method.

Moreover, specific methods of implementing the min-sum decoding method are disclosed in, for example, Patent Document 1 (Japanese Patent Laying-Open No. 2007-323515 and Patent Document 2 (Japanese Patent Laying-Open No. 2007-335992). These documents disclose a configuration in which a decoder performs parallel-processing on input data in units of code length to output decode data.

In order to apply the input data to a decoder that performs parallel-processing in such units of code length, a possible configuration is to convert the serial input data into parallel data of the code length, and then provide the data to the decoder through signal lines corresponding to the code length. However, the number of signal lines will become significant in such a configuration if the code length is long.

Another possible configuration is to apply input data of the code length serially into the decoder through one signal line. However, the time required for applying the data to the decoder will be increased in such a configuration.

A similar possible approach is to output decode data of the decode length serially in order to output decode data from the decoder to an external source. However, the time required for output from the decoder is time consuming in accordance with such a configuration.

There is also possible a configuration in which decode data of the decode length are output in parallel, and then output to an external source through signal lines of the decode length, followed by converting the parallel data of the decode length into serial data at an external source. However, this configuration is disadvantageous in that the number of signal lines required will be significant if the decode length is long.

SUMMARY OF THE INVENTION

In view of the foregoing, an object of the present invention is to provide an error correcting decoding apparatus adjusted such that the number of signal lines for input to a decoder is not significantly increased and the input rate to the decoder is not significantly reduced. Another object is to provide an error correcting decoding apparatus adjusted such that the number of signal lines for output from a decoder is not significantly increased, and the output rate of the decoder is not significantly reduced.

An error correcting decoding apparatus according to a first aspect of the present invention is directed to an error correcting decoding apparatus for performing decoding in units of code length N, including a decoder applying decode processing to N input data in parallel, a serial-parallel conversion circuit providing N input data applied in series to the decoder dividedly over several times, and B1 (B1 is a natural number of at least 2 and less than N) first lines connecting the serial-parallel conversion circuit with the decoder, one input data being transmitted through each first line.

Preferably, the serial-parallel conversion circuit includes a first storage unit for storing N input data. The first storage unit outputs the stored N input data to the decoder dividedly over several times through the first lines.

Preferably, the first storage unit includes B1 dual port memories, each having one input and one output. The serial-parallel conversion circuit includes a switch for switching between any of the B1 dual port memories into which N input data applied in series are to be stored. The B1 dual port memories and the B1 first lines are connected in a one-to-one correspondence.

Preferably, the first storage unit includes B1 dual port memories, each having one input and one output. Each dual port memory stores in duplication N input data applied in series. The B1 dual port memories and the B1 first lines are connected in a one-to-one correspondence. Each dual port memory outputs data among the N input data, differing from each other.

Preferably, B1 is a common divisor of N.

The error correcting decoding apparatus according to the first aspect of the present invention is directed to an error correcting decoding apparatus for performing decoding in units of decode length K. The error correcting decoding apparatus includes a decoder applying decode processing to input data in parallel to generate K decode data, a parallel-serial conversion circuit receiving K decode data from the decoder dividedly over several times to output K decoded data in series to an external source, and B2 (B2 is a natural number of at least 2 and less than K) second lines connecting the decoder with the parallel-serial conversion circuit.

Preferably, the parallel-serial conversion circuit includes a second storage unit storing K decode data. The second storage unit receives the K decode data from the decoder dividedly over several times through the second lines.

Preferably, the second storage unit includes B2 dual port memories, each having one input and one output. The parallel-serial conversion circuit further includes a second switch for switching between any of the B2 dual port memories from which data is to be output. The B2 dual port memories and the B2 second lines are connected in a one-to-one correspondence.

Preferably, B2 is a common divisor of K.

According to an aspect of the present invention, there can be realized an error correcting decoding apparatus adjusted such that the number of signal lines for input to the decoder is not increased significantly, and the input rate to the decoder is not reduced significantly.

According to another aspect of the present invention, there can be realized an error correcting decoding apparatus adjusted such that the number of signal lines for output from the decoder is not increased significantly, and the output rate from the decoder is not reduced significantly.

The above and other objects, features, aspects, and advantages of the present invention will become apparent from the detailed description of the present invention in association with the attached drawings.

BRIEF DESCRIPTION OF THE DRAWINGS

FIG. 2 represents a list of the corresponding relationship between the output data of a modulator and a demodulator when optical fiber constitutes the communication channel.

FIG. 10 is a diagram to describe data transfer between an S/P converter and a first register in a decoder according to a third embodiment of the present invention.

DESCRIPTION OF THE PREFERRED EMBODIMENTS

First Embodiment

Figure 1:
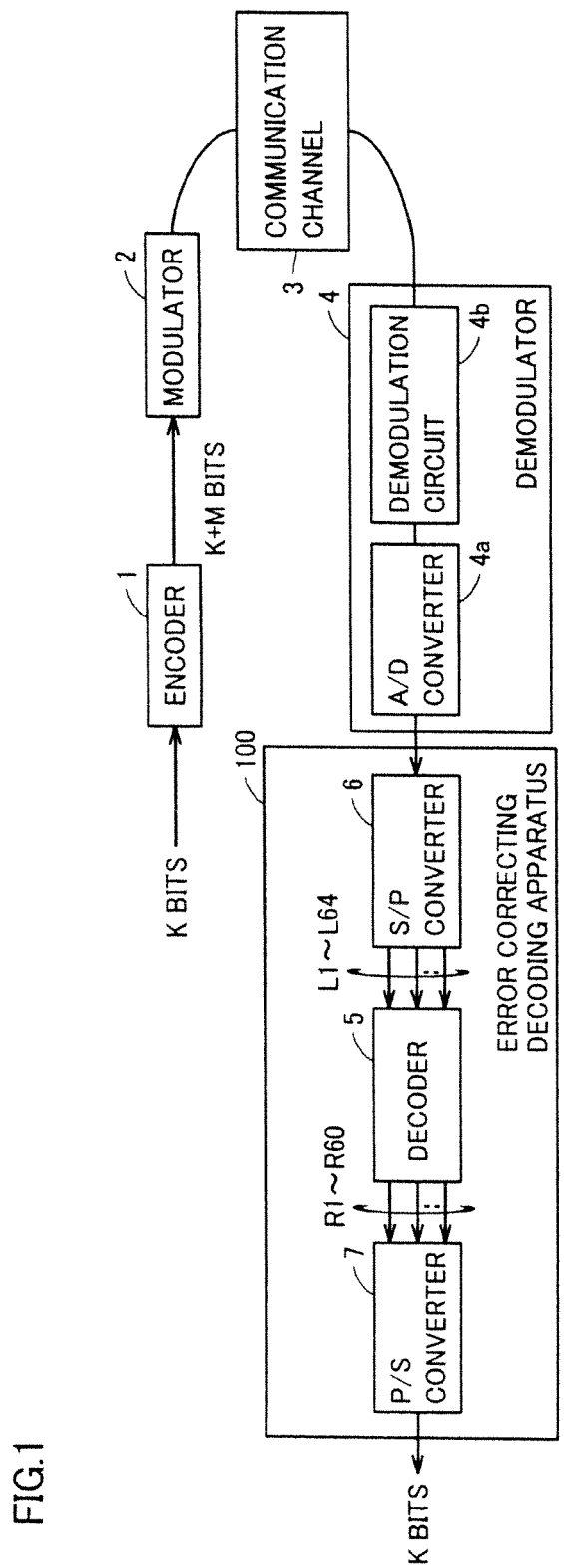
FIG. 1 represents an example of a configuration of a communication system employing an error correcting decoding apparatus according to an embodiment of the present invention.

FIG. 1 represents an example of a configuration of a communication system employing an error correcting decoding apparatus according to an embodiment of the present invention.

Referring to FIG. 1, the communication system includes, at the transmission side, an encoder 1 adding a redundant bit for error correction to transmission information to generate a transmission code, and a modulator 2 modulating the code of (K+M) (=N) bits from encoder 1 according to a predetermined scheme for output onto a communication channel 3.

Encoder 1 adds M bits that are redundant bits for parity computation to the information bit of K bits to generate LDPC codes (low-density parity-check codes) of (K+M) (=N) bits. In a parity check matrix H, the row corresponds to redundant bits, whereas the column corresponds to code bits. Here, N corresponds to the code length.

Modulator 2 carries out modulation such as amplitude modulation, phase modulation, code modulation, frequency modulation, orthogonal frequency-division multiplexing modulation, or the like according to the configuration of communication channel 3. For example, in the case where optical fiber constitutes communication channel 3, light intensity modulation (one type of amplitude modulation) is carried out by modifying the brightness of the laser diode according to the transmission information bit value at modulator 2. For example, when the transmission data bit is "0", the emission intensity of this laser diode is increased to be transmitted as "+1". When the transmission data bit is "1", the emission intensity of the laser diode is lowered and converted into "−1" to be transmitted.

At the reception side, there are provided a demodulator 4 demodulating a demodulation signal transmitted through communication channel 3 to demodulate digital codes of (K+M) bits, and an error correcting decoding apparatus 100 applying a parity check matrix operation processing to the codes of (K+M) bits from demodulator 4 to reproduce the former information of K bits.

Demodulator 4 carries out demodulation processing according to the transmission mode of communication channel 3. For example, in the case of amplitude modulation, phase modulation, code modulation, frequency modulation, orthogonal frequency-division multiplexing modulation and the like, demodulator 4 carries out the relevant processing of amplitude demodulation, phase demodulation, code demodulation, frequency demodulation, and the like. Demodulator 4 includes a demodulation circuit 4a demodulating a signal applied from communication channel 3, and an A/D converter 4b converting an analog demodulation signal generated by demodulation circuit 4a into a digital signal. Output data Xn from A/D converter 4b is generally data of L values (L≥2).

FIG. 2 represents a list of the corresponding relationship between the output data from modulator 2 and demodulator 4 in the case where optical fiber constitutes communication channel 3. Referring to FIG. 2 corresponding to optical fiber constituting communication channel 3, modulator 2 increases and decreases the emission intensity of the laser diode directed to transmission (light emitting diode) when the transmission data is "0" and "1", respectively, to output "1" and "−1", respectively, for transmission, as mentioned above.

By the transmission loss and the like at communication channel 3, the light intensity transmitted to demodulator 4 has an analog intensity distribution from the highest intensity to the lowest intensity. Demodulator 4 applies quantization processing (analog/digital conversion) to the input light signal to detect the light reception level. In FIG. 2, the light reception level of 8 steps indicates the reception signal intensity when quantization is applied. Specifically, the light reception level of "7" implies that the emission intensity is very high. The light reception level of "0" implies that the light intensity is very low. Each light reception level is set corresponding to signed data and output from demodulator 4. Demodulator 4 provides the output of data "3" when the light reception level is "7", and data "−4" when the light reception level is "0". Therefore, a multi-level quantized signal is output from demodulator 4 with respect to a reception signal of 1 bit. In FIG. 2, 3-bit data quantized at 8 levels is generated at demodulator 4.

Error correcting decoding apparatus 100 is directed to carry out decoding in units of code length N and decode length K, and includes an S/P converter 6, a decoder 5, a P/S converter 7, first signal lines L1-L64 connecting S/P converter 6 with decoder 5, and second signal lines R1-R60 connecting decoder 5 with P/S converter 7.

S/P converter 6 converts the N reception information (each constituting 3-bit data) Xn serially output from A/D converter 4b into parallel data dividedly over several times for output to decoder 5 through first signal lines L1-L64.

Each of first signal lines L1-L64 transmits one reception information (each constituting 3-bit data).

Decoder 5 receives the N reception information Xn sent from S/P converter 6 to apply an LDPC parity check matrix according to the min-sum decoding method to restore the information to the former K bits. Decoder 5 performs decode processing in parallel on the N reception information Xn to generate a decode word of K bits.

Each of second signal lines R1-R60 transmits 1 bit of a decode word.

P/S converter 7 receives in parallel the decode word of K bits from decoder 5 dividedly over several times through second signal lines R1-R60 to output a decode word of K bits in series.

Figure 3:
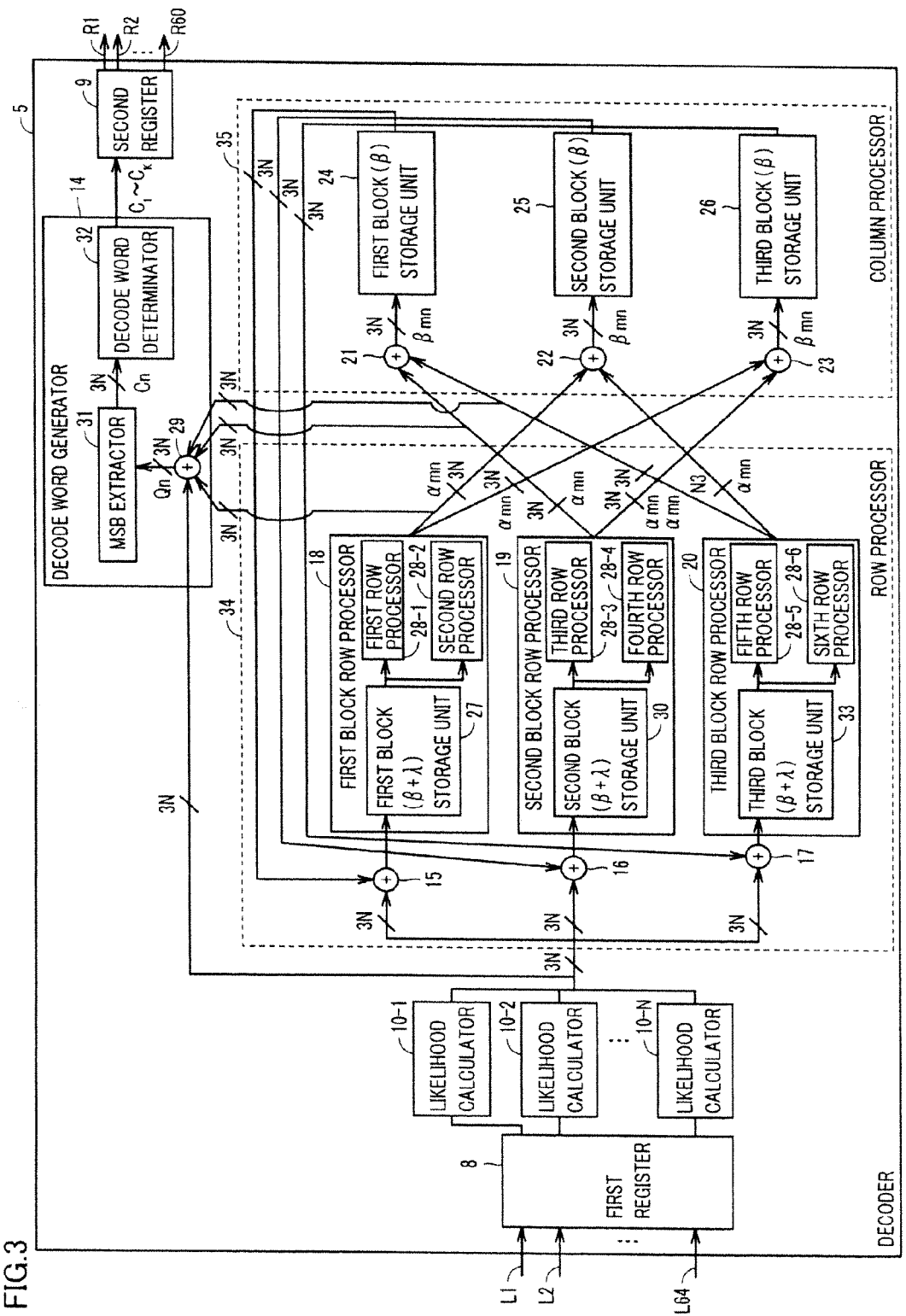
FIG. 3 represents a configuration of a decoder according to an embodiment of the present invention.

FIG. 3 represents a configuration of a decoder according to an embodiment of the present invention. FIG. 3 represents the configuration in the case where a parity check matrix H having a column weight of 3 that is the number of "1"s in each column with a code length N of 1024 and an information bit length K of 960.

Referring to FIG. 3, decoder 5 includes a first register 8 storing data output from S/P converter 6, likelihood calculators 10-1 to 10-N calculating the log-likelihood ratio of N data in first register 8, a row processor 34 performing processing on a row in a parity check matrix, a column processor 35 performing processing on a column in the parity check matrix, a decode word generator 14 generating a decode word according to a log-likelihood ratio λn from likelihood calculators 10-1 to 10-N and the output bit (external value log ratio) αmn of row processor 34, and a second register 9 to store the generated decode word.

First Register

First register 8 is connected to S/P converter 6 via first signal lines L1-L64. First register 8 receives the N reception information Xn from S/P converter 6 through first signal lines L1-L64 dividedly over several times to store N reception information Xn.

Likelihood Calculator

Likelihood calculators 10-1 to 10-N generate a log-likelihood ratio Xn, independent of the noise information of the reception signal. Generally when noise information is taken into account, this log-likelihood ratio λn is given by Xn/(2×σ²), where σ represents the noise variance. In the embodiment of the present invention, likelihood calculators 10-1 to 10-N are constituted of buffer circuits or constant multiplication circuits. The log-likelihood ratio λn is given by Xn×f, where f is a positive number of nonzero. By calculating the log-likelihood ratio without utilizing the noise information, the circuit configuration as well as the calculation process is simplified. In the min-sum decoding method, linearity is maintained in the signal processing since computation is carried out using the minimum value in the process of the check matrix. Therefore, the processing of normalizing output data according to noise information is not required.

Row Processor and Column Processor

Row processor 34 performs row processing for each member in a row of parity check matrix H according to equation (1) to update external value log ratio αmn.

Column processor 35 performs column processing for each member in a column of parity check matrix H to update priori value log ratio βmm according to equation (2).

$$\alpha_{mn} = \left( \prod_{n' \in A(m)\backslash n} \text{sign}(\lambda_{n'} + \beta_{mn'}) \times \min_{n' \in A(m)\backslash n} |\lambda_{n'} + \beta_{mn'}| \right) \quad (1)$$

$\beta_{mn}$: initial value is 0

$$\beta_{mn} = \sum_{m' \in B(n)\backslash m} \alpha_{m'n} \quad (2)$$

where n'∈A(m)\ n and m'∈B(n)\m imply a member beside itself in each of equations (1) and (2). For external value log ratio αmn, n'≠n. For priori value log ratio βmm, m'≠m. The subscript "mn" indicating the position in the row and column of α and β, generally indicated in lower subscript, are indicated as common horizontally aligned characters for the sake of easiness in reading.

Function sign (x) is defined by the following equation (3).

$$\text{sign}(x) = \begin{cases} 1 & x \geq 0 \\ -1 & x < 0 \end{cases} \quad (3)$$

A set A (m) and a set B (n) are subsets of a set [1, N]= {1, 2, . . . , N} when two dimensional M·N matrix H=[Hmn] is taken as the LDPC code parity matrix subject to decoding.

A (m)={n:Hmn=1}

B (n)={m:Hmn=1}

A specific configuration of row processor 34 and column processor 35 will be described hereinafter.

Row processor 34 includes a first block row processor 18, a second block row processor 19, a third block row processor 20, a first adder (β+λ) 15 arranged corresponding to first block row processor 18, a second adder (β+λ) 16 arranged corresponding to second block row processor 19, and a third adder (β+λ) 17 arranged corresponding to third block row processor 20.

First block row processor 18 includes a first block (β+λ) storage unit 27 storing the latest value of (β+λ) of N columns corresponding to the first block in parity check matrix H, a first row processor 28-1, and a second row processor 28-2.

Second block row processor 19 includes a second block (β+λ) storage unit 30 storing the latest value of (β+λ) of N columns corresponding to the second block in parity check matrix H, a third row processor 28-3, and a fourth row processor 28-4.

Third block row processor 19 includes a third block (β+λ) storage unit 33 storing the latest value of (β+λ) of N columns corresponding to the third block in parity check matrix H, a fifth row processor 28-5 and a sixth row processor 28-6.

Column processor 35 includes a first block (β) storage unit 24 storing the latest value of (β) of N columns corresponding to the first block in parity check matrix H, a second block (β) storage unit 25 storing the latest value of (β) of N columns corresponding to the second block in parity check matrix H, a third block (β) storage unit 26 storing the latest value of (β) of N columns corresponding to the third block in parity check matrix H, a first adder (β) 21 arranged corresponding to first block (β) storage unit 24, a second adder (β) 22 arranged corresponding to second block (β) storage unit 25, and a third adder (β) 23 arranged corresponding to third block (β) storage unit 26.

First adder (β+λ) 15, second adder (β+λ) 16, third adder (β+λ) 17, first adder (β) 21, second adder (β) 22 and third adder (β) 23 have N adders corresponding to the N columns. Each adder performs adding for each corresponding column.

The operation of each element in row processor 34 and column processor 35 is described in detail in Japanese Patent Laying-Open No. 2007-325011, for example.

M-th Row Processor

Figure 4:
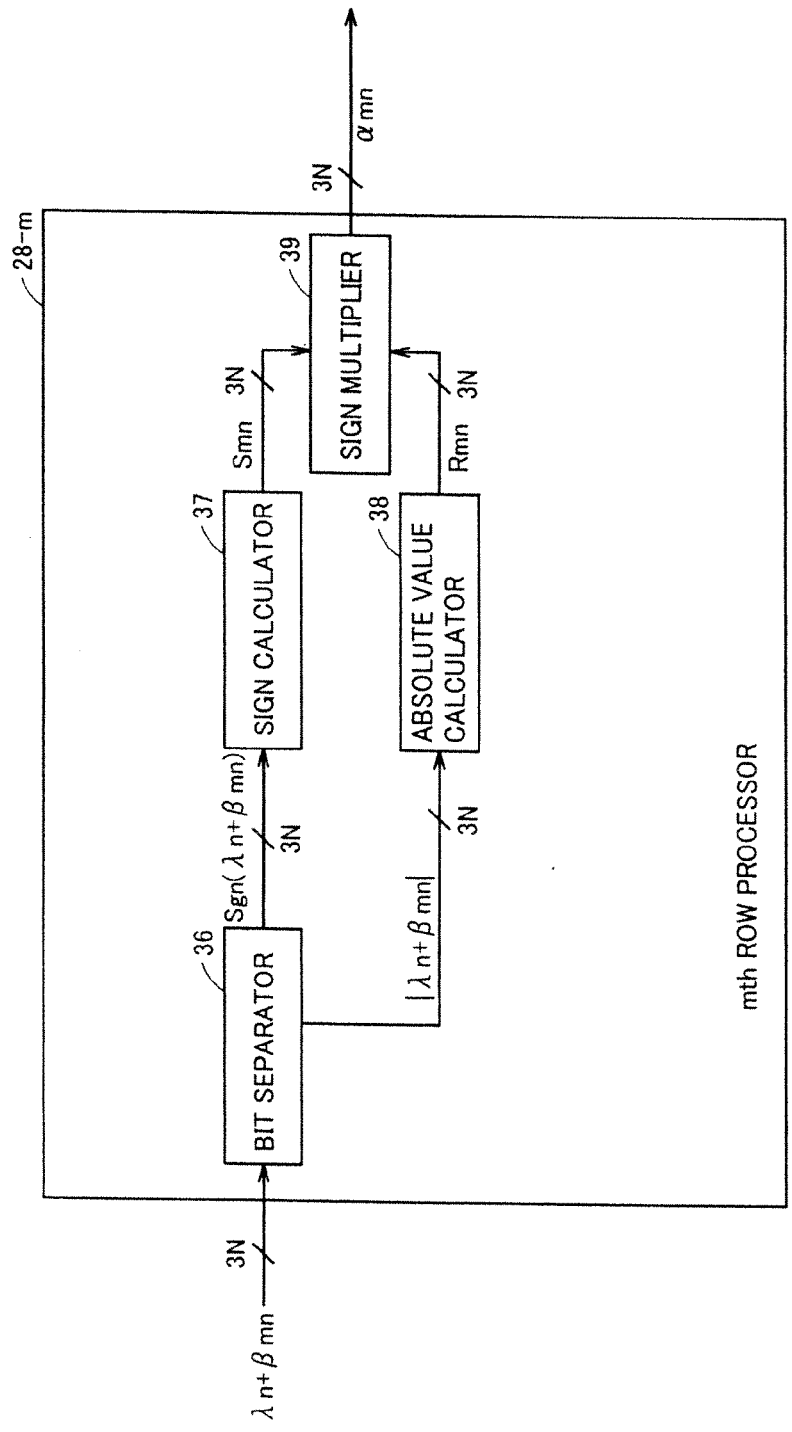
FIG. 4 represents a configuration of the m-th (m=1 to 6) row processor of FIG. 3.

FIG. 4 represents a configuration of the m-th (m=1~6) processor shown in FIG. 3.

Referring to FIG. 4, the m-th processor 28-*m* includes a bit separator 36, a sign calculator 37, an absolute value calculator 38, and a code multiplier 39.

Bit separator 36 receives S signals {(λn'+(βmn'): n' is one of S different numbers satisfying Hmn'=1} for separation into a plurality of bits representing the absolute value thereof and a bit representing the sign (that is, the most significant bit) to output an absolute value formed of absolute value bits to absolute value absolute value calculator 38 and a sign formed of a sign bit to sign calculator 37. As used herein, S is the row weight.

Sign calculator 37 performs calculation of the sign section (set as Smn) in equation (1) based on S signals {sgn (λn'+ βmn'): n' is one of S different numbers satisfying Hmn'=1}.

Absolute value calculator 38 performs calculation of the absolute value section (set as Rmn) in equation (1) based on S signals {|λn'+βmn'|: n' is one of S different numbers, satisfying Hmn'=1}.

Code multiplier 39 outputs an external value log ratio αmn based on Smn output from sign calculator 37 as the sign bit and Rmn output from absolute value calculator 38 as the absolute value bit.

Decode word Generator

Decode word generator 14 includes an adder 29, an MSB extractor 31, and a decode word determinator 32.

Adder 29 adds log-likelihood ratio λn and external value log ratio αmn according to equation (4) to calculate an estimate reception signal Qn.

$$Q_n = \lambda_n + \sum_{m \in B(n)} \alpha_{mn} \quad (4)$$

MSB extractor 31 extracts the most significant bit of estimate reception signal Qn as a primary estimate sign Cn, according to equation (5).

$$C_n = \begin{cases} 0, & \text{sign}Q_n = 1 \\ 1, & \text{sign}Q_n = -1 \end{cases} \quad (5)$$

Decode word determinator 32 includes a multiplier and an adder to identify whether primary estimate code word ($C_1$, $C_2$, . . . , $C_N$) constitutes a code word. i.e. whether it is appropriate as a decode word. Decode word determinator 32 causes row processor 34 and column processor 35 to end the iterative operation and outputs code word ($C_1$, $C_2$, . . . , $C_k$) as the decode word, when equation (6) is established, i.e. when the syndrome satisfies "0". Further, decode word determinator 32 also causes row processor 34 and column processor 35 to end the iterative operation and outputs code word ($C_1$, $C_2$, . . . , $C_k$) as the decode word to second register 9, when the iterative count of the row processing and column processing operations exceeds a predetermined value. Here, K corresponds to the decode length.

$$(C_1, C_2, \ldots, C_N) \cdot H^t = 0 \quad (6)$$

Second Register

Second register 9 stores the decode word of K bits generated at decode word generator 14.

Second register 9 is connected with P/S converter 7 via second signal lines R1-R60. Second register 9 outputs the decode word of K bits to P/S converter 7 dividedly over several times through second signal lines R2-R60.

Operation of Error Correcting Decoding Apparatus

Figure 5:
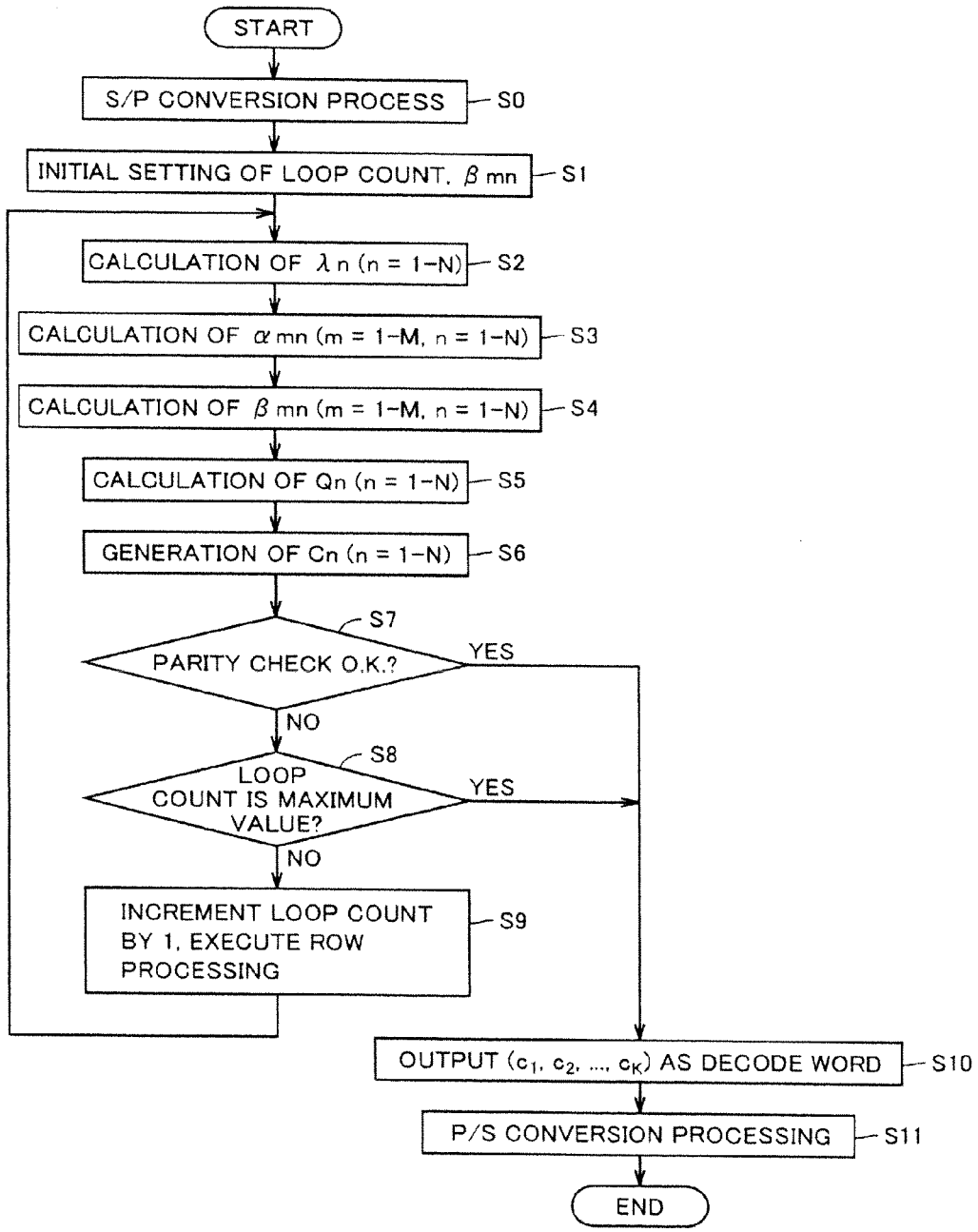
FIG. 5 is a flowchart representing the operation procedure of an error correcting decoding apparatus according to an embodiment of the present invention.

FIG. 5 is a flowchart representing the operation procedure of the error correcting decoding apparatus according to an embodiment of the present invention.

Referring to FIG. 5, S/P converter 6 converts the N reception information (each constituting 3-bit data) Xn output in series from A/D converter 4b into parallel data dividedly over several times for output to decoder 5 through first signal lines L1-L64 (step S0).

Then, as the initial operation, decoder 5 initializes the loop count and the priori value log ratio βmn. This loop count indicates the iterative operation of the column processing and row processing. A maximum value is determined in advance for this loop count. Priori value log ratio βmn is initialized to "1" (step 1).

Then, likelihood calculator 10-$n$ ($n$=1 to N) calculates the log-likelihood ratio λn of each reception information Xn (step S2).

Row processor 34 performs row processing on each member in a row in parity check matrix H according to equation (1) to update external value log ratio αmn (step S3).

Column processor 35 performs column processing on each member in a column in parity check matrix H according to equation (2) to update priori value log ratio βmn (step S4).

Decode word generator 14 uses log-likelihood ratio λn and external value log ratio αmn to obtain estimate reception signal $Q_n$ according to equation (4) (step S5).

Then, decode word generator 14 calculates primary estimate sign $C_n$ from estimate reception signal $Q_n$ according to equation (5) (step S6).

Decode word generator 14 performs a parity check for identifying whether the primary estimate code word ($C_1, C_2, \ldots, C_N$) constitutes a code word, i.e. whether it is appropriate as a decode word, according to equation (6).

When equation (6) is established, i.e. when the syndrome satisfies "0" (YES at step S7), decode word generator 14 causes row processor 34 and column processor 35 to end the iterative operation, and outputs code word ($C_1, C_2, \ldots, C_k$) as decode word C (=($C_1, C_2, \ldots, C_k$)) (step 10).

When equation (6) is not established (NO at step S7), and the loop count reaches the maximum value (YES at step S8), decode word generator 14 causes row processor 34 and column processor 35 to end the iterative operation, and outputs code word ($C_1, C_2, \ldots, C_k$) as decode word C (=($C_1, C_2, \ldots, C_k$)) (step S10).

Then, P/S converter 7 receives the decode word of K bits from decoder 5 dividedly over several times in parallel through second signal lines R1-R60 to output the K bits of the decode word in series (step S11).

When equation (6) is not established (NO at step S7), and the loop count has not yet reached the maximum value (NO at step S8), decode word generator 14 increments the loop count just by 1 (step S9), and returns to step S3 to repeat the process.

(S/P Converter)

Figure 6:
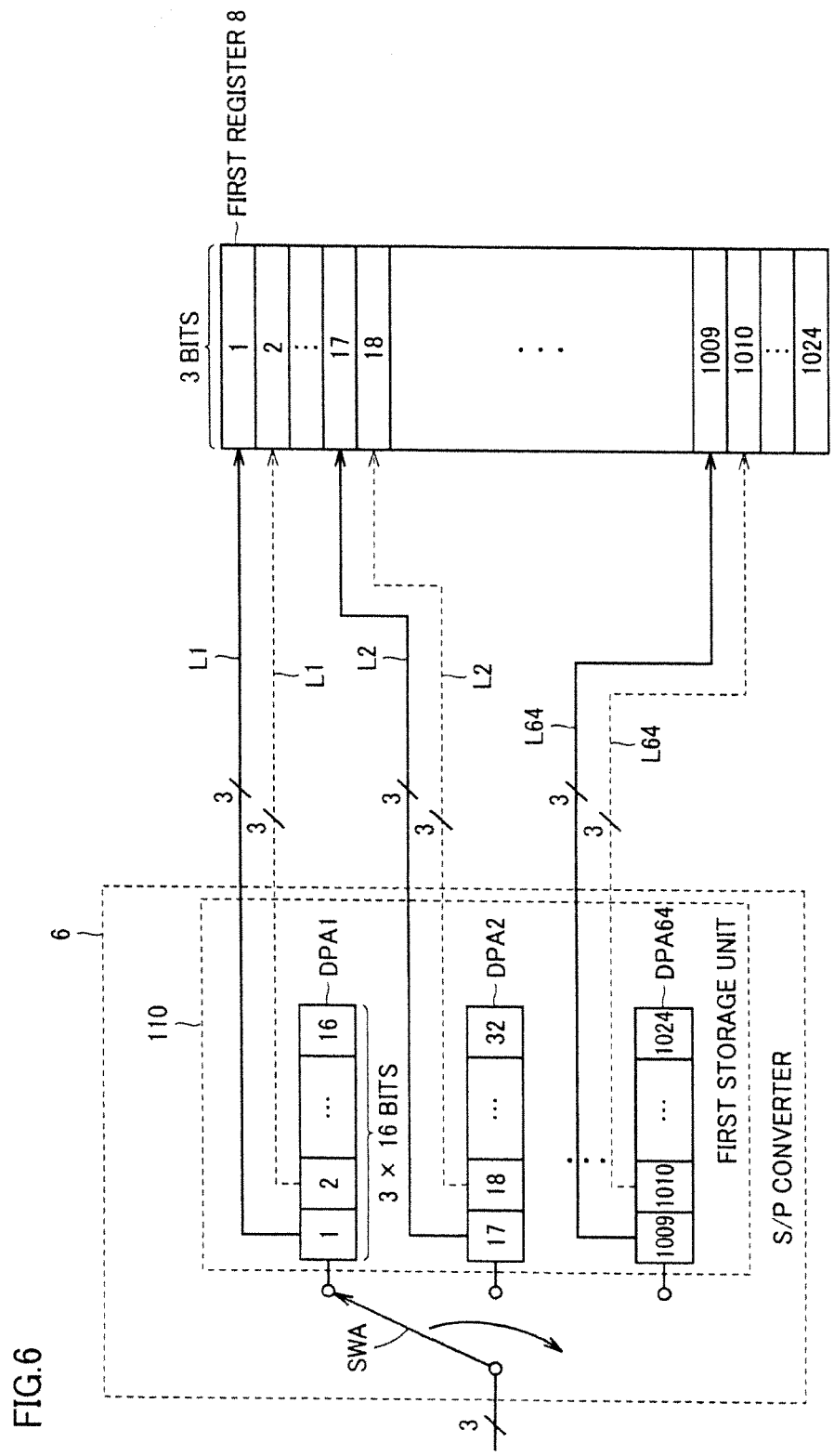
FIG. 6 is a diagram to describe data transfer between an S/P converter and a first register in a decoder according to a first embodiment of the present invention.

FIG. 6 is a diagram to describe data transfer between S/P converter 6 and first register 8 in decoder 5 according to the first embodiment of the present invention.

Referring to FIG. 6, S/P converter 6 includes a first switch SWA, and a first storage unit 110. First storage unit 110 includes 64 dual port memories DPA1-DPA64.

Each of dual port memories DPA1-DPA64 has a capacity of 3×16 bits to store 64 3-bit data. Each of dual port memories DPA1-DPA64 is connected to first signal lines L1-L64 in a one-to-one correspondence.

First, data transfer from A/D converter 4b to dual port memories DPA1-DPA64 will be described hereinafter.

First switch SW1 switches the storage destination of the serial data, each of 3 bits, output from A/D converter 4b in units of 64 data. Specifically, first switch SWA sequentially outputs the 1st data to 16th data from A/D converter 4b to dual port memory DPA1. Then, first switch SWA sequentially outputs the 17th to 32nd data from A/D converter 4b to dual port memory DPA2. Hereinafter, in a similar manner, first switch SWA sequentially outputs the last 1009 th data to 1024 th data from A/D converter 4b to dual port memory DPA64.

As a result, the 1st data to 16th data are sequentially stored in dual port memory DPA1 from the beginning. The 17th to 32nd data are sequentially stored in dual port memory DPA2 from the beginning. Hereinafter, in a similar manner, the 1009th data to 1024th data are sequentially stored in dual port memory DPA64 from the beginning.

Data transfer from dual port memories DPA1-DPA64 to first register 8 will be described hereinafter.

64 data will be transferred at one time from dual port memories DPA1-DPA64 to first register 8 through first signal lines L1-L64.

At the first pass, the data stored in the head position in each of dual port memories DPA1-DPA64 is output in parallel to first register 8 through first signal lines L1-L64. Specifically, the first data stored in the head position in dual port memory DPA1 is transmitted to the first storage position in first register 8 through first signal line L1. The 17th data stored in the head position in dual port memory DPA2 is transmitted to the 17th storage position in first register 8 through first signal line L2. Hereinafter, in a similar manner, the 1009th data stored in the head position in dual port memory DPA64 is transmitted to the 1009th storage position in first register 8 through first signal line L64.

At the second pass, the data stored in the second position from the beginning in each of dual port memories DPA1-DPA64 is output to first register 8 through first signal lines L1-L64 in parallel. Specifically, the second data stored in the second position from the beginning in dual port memory DPA1 is transmitted to the second storage position in first register 8 through first signal line L1. The 18th data stored in the second position from the beginning in dual port memory DPA2 is transmitted to the 18th storage position in the first register 8 through first signal line L2. Hereinafter, in a similar manner, the 1010th data stored in the second position from the beginning in dual port memory DPA64 is transmitted to the 1010th storage position in first register 8 through first signal line L64.

Thus, in a similar manner, the 1024 data stored in dual port memories DPA1-DPA64 are transmitted dividedly over 16 times to first register 8, 64 data at a time.

P/S Converter

Figure 7:
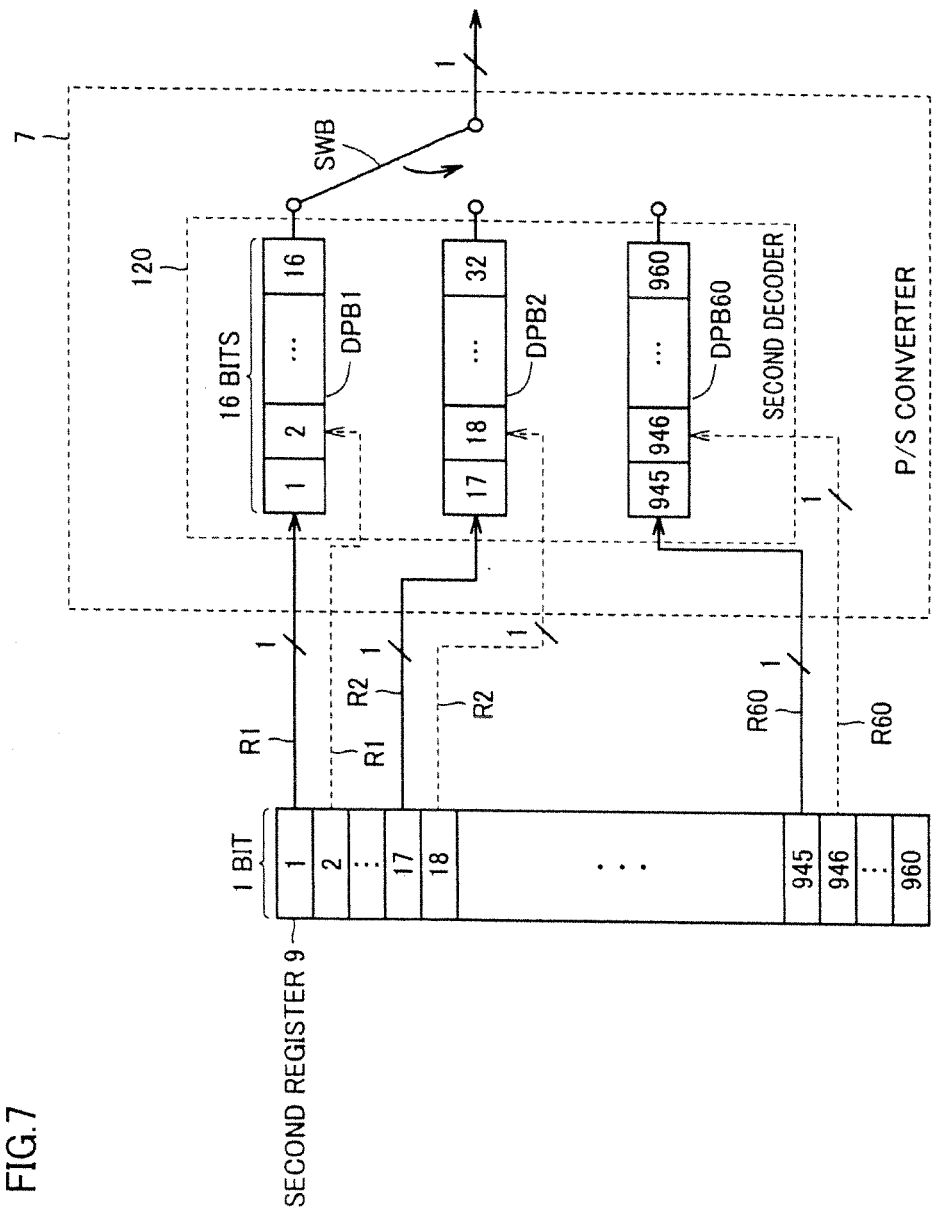
FIG. 7 is a diagram to describe data transfer between a second register in the decoder and a P/S converter according to the first embodiment of the present invention.

FIG. 7 is a diagram to describe data transfer between second register 9 in decoder 5 and P/S converter 7 according to the first embodiment of the present invention.

Referring to FIG. 7, P/S converter 7 includes a second storage unit 120 and a second switch SWB. Second storage unit 120 includes 60 dual port memories DPB1-DPB60.

Each of dual port memories DPB1-DPB60 has a capacity of 1×16 bits to store sixteen 1-bit data. Dual port memories DPB1-DPB60 are connected to second signal lines R1-R60 in a one-to-one correspondence.

Data transfer from second register 9 to dual port memories DPB1-DPB60 will be described hereinafter.

60 data will be transferred at one time from second register 9 to dual port memories DPB1-DPB60 through second signal lines R2-R60.

At the first pass, the first data stored in second register 9 is output to the head storage position in dual port memory DPB1 through second signal line R1. At the same time, the 17th data stored in second register 9 is output to the head storage position in dual port memory DPB2 through second signal line R2. Hereinafter, at the same time in a similar manner, the 945th data stored in second register 9 is output to the head storage position in dual port memory DPB60 through second signal line R60.

At the second pass, the second data stored in second register 9 is output to the second storage position from the beginning in dual port memory DPB1 through second signal line R1. At the same time, the 18th data stored in second register 9 is output to the second storage position from the beginning in dual port memory DPB2 through second signal line R2.

Hereinafter, at the same time in a similar manner, the 946th data stored in second register 9 is output to the second storage position from the beginning in dual port memory DPB60 through second signal line R60.

In a similar manner hereinafter, the 960 data stored in second register 9 are transmitted dividedly over 16 times to dual port memories DPB1-DPB60, 60 data at a time.

Data transfer from dual port memories DPB1-DPB60 to an external source will be described hereinafter.

Second switch SWB switches between any of dual port memories DPB1-DPB60 for output of every 16 data. Specifically, second switch SWB first switches the input source to dual port memory DPB1 to sequentially output the 1st data to 16th data stored in dual port memory DPB1. Then, second switch SWB switches the input source to dual port memory DPB2 to sequentially output the 17th to 32nd data stored in dual port memory DPB2. Hereinafter, in a similar manner, second switch SWB finally switches the input source to dual port memory DPB60 to sequentially output the 945th to 960th data stored in dual port memory DPB60.

Thus, according to the error correcting decoding apparatus in the embodiment of the present invention, the number of signal lines from the S/P converter to the decoder is set to 64 for the code length of 1024, allowing 64 data to be transferred in parallel over 16 times from the S/P converter to the decoder, 64 data at a time. Therefore, transfer can be achieved speedily although the number of signal lines will be increased, as compared to the case where all 1024 data are transferred in series, and the number of signal lines can be reduced although the transfer rate will be reduced, as compared to the case where all the 1024 data are transferred in parallel.

Similarly, according to the error correcting decoding apparatus of the present embodiment, the number of signal lines for transmission from the decoder to the P/S converter is set to 60 for the decode length of 960, allowing data to be transferred in parallel over 16 times from the decoder to the P/S converter, 60 data at a time. Therefore, high speed transfer is allowed although the number of signal lines will be increased, as compared to the case where all 960 data are transferred in series, and the number of signal lines can be reduced although the transfer rate will be reduced, as compared to the case where all 960 data are transferred in parallel.

By such a configuration, an appropriate configuration balanced in the requirement of reducing the number of signal lines and the requirement of increasing the transfer speed can be realized.

Second Embodiment

S/P Converter

Figure 8:
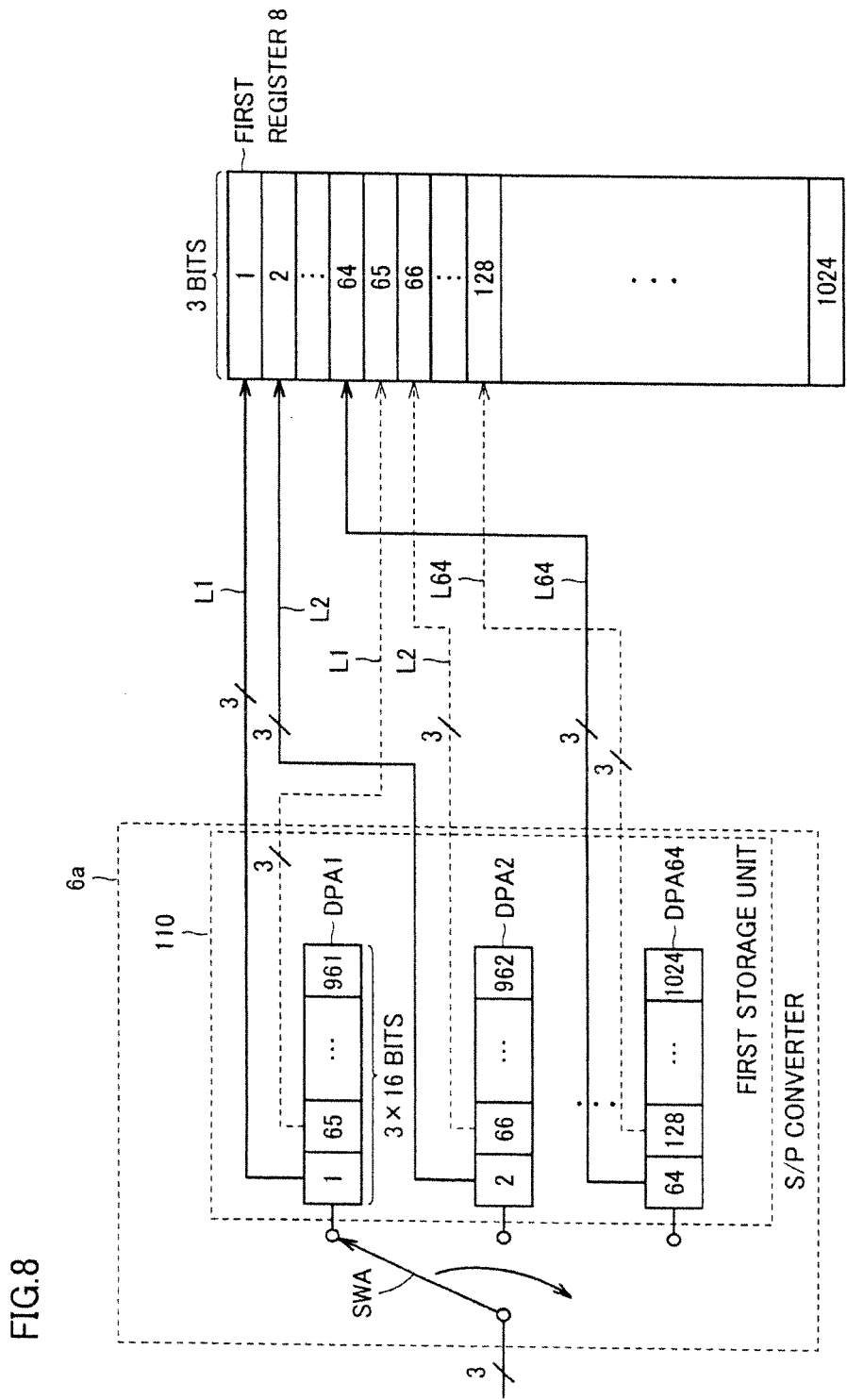
FIG. 8 is a diagram to describe data transfer between an S/P converter and a first register in a decoder according to a second embodiment of the present invention.

FIG. 8 is a diagram to describe data transfer between S/P converter 6*a* and first register 8 in decoder 5 according to a second embodiment of the present invention.

Referring to FIG. 8, S/P converter 6*a* includes a first switch SWA, and a first storage unit 110. First storage unit 110 includes 64 dual port memories DPA1-DPA64.

Each of dual port memories DPA1-DPA64 has a capacity of 3×16 bits to store 64 3-bit data. Each of dual port memories DPA1-DPA64 is connected to first signal lines L1-L64 in a one-to-one correspondence.

First, data transfer from A/D converter 4*b* to dual port memories DPA1-DPA64 will be described hereinafter.

First switch SW1 switches the storage destination of the serial data, each of 3 bits, output from A/D converter 4*b*, one data at a time. Specifically, first switch SWA outputs the first data from A/D converter 4*b* to the head position in dual port memory DPA1. Then, first switch SWA outputs the second data from A/D converter 4*b* to the head position in dual port memory DPA2. Hereinafter, in a similar manner, first switch SWA outputs the 64th data from A/D converter 4*b* to the head position in dual port memory DPA64.

Furthermore, first switch SWA outputs the 65th data from A/D converter 4*b* to the second position from the beginning in dual port memory DPA1. Then, first switch SWA outputs the 66th data from A/D converter 4*b* to the second position from the beginning in dual port memory DPA2. Hereinafter, in a similar manner, first switch SWA outputs the 128th data from A/D converter 4*b* to the second position from the beginning in dual port memory DPA64.

By repeating the above-described process, the 1st, 65th, . . . , 961st data are sequentially stored in dual port memory DPA1 from the beginning. In dual port memory DPA2, the 2nd, 66th, . . . , 962nd data are sequentially stored in dual port memory DPA2 from the beginning. Hereinafter, in a similar manner, the 64th, 128th, . . . , 1024th data are sequentially stored in dual port memory DPA64 from the beginning.

Data transfer from dual port memories DPA11-DPA64 to first register 8 will be described hereinafter.

64 data will be transferred at one time from dual port memories DPA1-DPA64 to first register 8 through first signal lines L1-L64.

At the first pass, the data stored in the head position in each of dual port memories DPA1-DPA64 is output in parallel to first register 8 through first signal lines L1-L64. Specifically, the first data stored in the head position in dual port memory DPA1 is transmitted to the first storage position in first register 8 through first signal line L1. At the same time, the second data stored in the head position in dual port memory DPA2 is transmitted to the second storage position in first register 8 through first signal line L2. Hereinafter, at the same time in a similar manner, the 64th data stored in the head position in dual port memory DPA64 is transmitted to the 64th storage position in first register 8 through first signal line L64.

At the second pass, the data stored in the second position from the beginning in each of dual port memories DPA1-DPA64 is output to first register 8 through first signal lines L1-L64 in parallel. Specifically, the 65th data stored in the second position from the beginning in dual port memory DPA1 is transmitted to the 65th storage position in first register 8 through first signal line L1. At the same time, the 66th data stored in the second position from the beginning in dual port memory DPA2 is transmitted to the 66th storage position in the first register 8 through first signal line L2. Hereinafter, at the same time in a similar manner, the 128th data stored in the second position from the beginning in dual port memory DPA64 is transmitted to the 128th storage position in first register 8 through first signal line L64.

Hereinafter, in a similar manner, the 1024 data stored in dual port memories DPA1-DPA64 are transmitted dividedly over 16 times to first register 8, 64 data at a time.

P/S Converter

Figure 9:
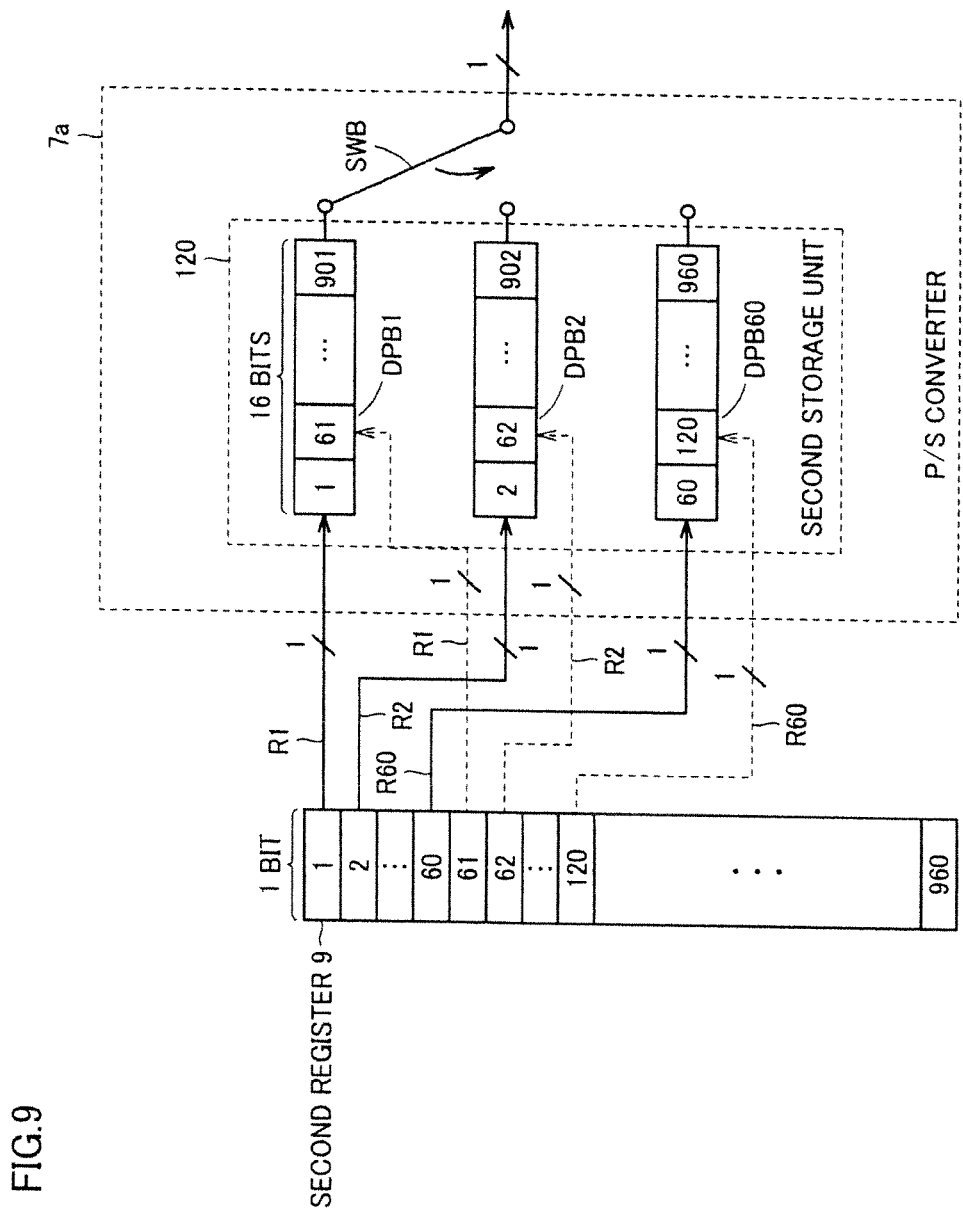
FIG. 9 is a diagram to describe data transfer between a second register in the decoder and a P/S converter according to the second embodiment of the present invention.

FIG. 9 is a diagram to describe data transfer between second register 9 in decoder 5 and P/S converter 7*a* according to the second embodiment.

Referring to FIG. 7, P/S converter 7*a* includes a second storage unit 120, and a second switch SWB. Second storage unit 120 includes 60 dual port memories DPB1-DPB60.

Each of dual port memories DPB1-DPB60 has a capacity of 1×16 bits to store sixteen 1-bit data. Each of dual port memories DPB1-DPB60 is connected to second signal lines R1-R60 in a one-to-one correspondence.

First, data transfer from second register 9 to dual port memories DPB1-DPB60 will be described.

60 data will be transferred at one time from second register 9 to dual port memories DPB1-DPB60 through second signal lines R1-R60.

At the first pass, the first data stored in second register 9 is output to the head storage position in dual port memory DPB1 through second signal line R1. At the same time, the second data stored in second register 9 is output to the head storage position in dual port memory DPB2 through second signal line R2. Hereinafter, at the same time in a similar manner, the 60th data stored in second register 9 is output to the head storage position in dual port memory DPB60 through second signal line R60.

At the second pass, the 61st data stored in second register 9 is output to the second storage position from the beginning in dual port memory DPB1 through second signal line R1. At the same time, the 62nd data stored in second register 9 is output to the second storage position from the beginning in dual port memory DPB2 through second signal line R2. Hereinafter, at the same time in a similar manner, the 120th data stored in second register 9 is output to the second storage position from the beginning in dual port memory DPB60 through second signal line R60.

In a similar manner hereinafter, the 960 data stored in second register 9 are transmitted dividedly over 16 times to dual port memories DPB1-DPB60, 60 data at a time.

Data transfer from dual port memories DPB1-DPB60 to an external source will be described hereinafter.

Second switch SWB switches between any of dual port memories DPB1-DPB60 for the output of every 1 data. Specifically, second switch SWB first switches the input source to dual port memory DPB1 to output the first data stored in the head position in dual port memory DPB1. Then, second switch SWB switches the input source to dual port memory DPB2 to output the second data stored in the head position in dual port memory DPB2. Hereinafter, in a similar manner, second switch SWB switches the input source to dual port memory DPB60 to output the 60th data stored in the head position in dual port memory DPB60.

Furthermore, second switch SWB switches the input source to dual port memory DPB1 to output the 61st data stored in the second position from the beginning in dual port memory DPB1. Then, second switch SWB switches the input source to dual port memory DPB2 to output the 62nd data stored in the second position from the beginning in dual port memory DPB2. Hereinafter, in a similar manner, second switch SWB switches the input source to dual port memory DPB60 to output the 120th data stored in the second position from the beginning in dual port memory DPB60.

By repeating the process set forth above, the 1st to 1024th data stored in dual port memories DPB1-DPB60 are sequentially output in series.

Likewise with the first embodiment, an appropriate configuration balanced in the requirement of reducing the number of signal lines and the requirement of increasing the speed of the transfer rate can be realized in the present embodiment.

Third Embodiment

S/P Converter

FIG. 10 is a diagram to describe data transfer between an S/P converter 6b and first register 8 in decoder 5 according to a third embodiment of the present invention.

Referring to FIG. 10, S/P converter 6b includes a first storage unit 130. First storage unit 130 includes 64 dual port memories DPC1-DPC64.

Each of dual port memories DPC2-DPC64 has a capacity of 3×1024 bits to store 1024 3-bit data. Data is read out from a specified address from each of dual port memories DPC1-DPC64. Each of dual port memories DPC1-DPC64 is connected to first signal lines L1-L64 in a one-to-one correspondence.

First, data transfer from A/D converter 4b to dual port memories DPC1-DPC64 will be described.

The first data from A/D converter 4b is output to the head position in dual port memories DPC1-DPC64. Then, the second data from A/D converter 4b is output to the second position from the beginning in dual port memories DPC1-DPC64. Hereinafter, in a similar manner, the last 1024th data from A/D converter 4b is output to the 1024th position from the beginning in dual port memories DPC1-DPC64.

As a result, the 1st to 1024th data are stored in duplication sequentially from the beginning in dual port memories DPC1-DPC64.

Data transfer from dual port memories DPC1-DPC64 to first register 8 will be described hereinafter.

64 data differing from each other are transferred in parallel in one pass from dual port memories DPC1-DPC64 to first register 8 through first signal lines L1-L64.

At the first pass, the head position in dual port memory DPC1 is addressed, and the first data stored therein is transmitted to the first storage position in first register 8 through first signal line L1. At the same time, the second position from the beginning in dual port memory DPC2 is addressed, and the second data stored therein is transmitted to the second storage position in first register 8 through first signal line L2. Hereinafter, at the same time in a similar manner, the 64th position from the beginning in dual port memory DPC64 is addressed, and the 64th data stored therein is transmitted to the 64th storage position in first register 8 through first signal line L64.

At the second pass, the 65th position from the beginning in dual port memory DPC1 is addressed, and the 65th data stored therein is transmitted to the 65th storage position in first register 8 through first signal line L1. At the same time, the 66th position from the beginning in dual port memory DPC2 is addressed, and the 66th data stored therein is transmitted to the 66th storage position in first register 8 through first signal line L2. Hereinafter, at the same time in a similar manner, the 128th position stored at the 128th position from the beginning in dual port memory DPC64 is addressed, and the 128th data stored therein is transmitted to the 128th storage position in first register 8 through first signal line L64.

Similarly, 1024 data differing from each other and stored in dual port memories DPC1-DPC64 are transmitted dividedly over 16 times to first register 8, 64 data at a time.

Likewise with the first embodiment, an appropriate configuration balanced in the requirement of reducing the number of signal lines and the requirement of increasing the transfer speed can be realized in the present embodiment. By being dispensed with first switch SWA, the technical requirement related to high speed operation of first switch SWA can be avoided.

Modification

The present invention is not limited to the above-described embodiments, and may include a modification set forth below, for example.

(1) Number of Signal Lines and Transfer Count

In the present embodiment of the present invention, the S/P converter and the decoder are connected through 64 first signal lines. 1024 data corresponding to the code length of 1024 are transferred dividedly over 16 times from the S/P converter to the decoder, 64 data at a time. However, data transfer is not limited thereto. For example, when the code length is N, the number of first signal lines may be set as B1 that is a common divisor of N to transfer data over N/B1 (times). B1 is a natural number of at least 2 and less than N. By selecting a common divisor of the code length for the number of the first signal lines, the processing content at each pass is set in common, simplifying the processing algorithm.

Alternatively, a number that is not a common divisor of N may be selected for the number of first signal lines, and the data transfer of the last pass may be carried out using only a portion of the first signal lines.

Similarly, in the embodiments of the present invention, the decoder and P/S converter are connected through 60 second signal lines. 960 data corresponding to the decode length of 960 are transferred from the decoder to the P/S converter dividedly over 16 times, 60 parallel data at a time. However, data transfer is not limited thereto.

For example, when the decode length is K, the number of second signal lines may be set at B2 that is a common divisor of K to transfer data over K/B2 (times). B2 is a natural number of at least 2 and less than K. By selecting a common divisor of the decode length for the number of the second signal lines, the processing content at each pass is set in common, simplifying the processing algorithm.

Alternatively, a number that is not a common divisor of K may be selected for the number of second signal lines, and the data transfer of the last pass may be carried out using only a portion of the second signal lines.

(2) First Storage Unit, Second Storage Unit

The first storage unit in the first and second embodiments of the present invention includes, but not limited to, a first switch SWA switching between 64 output destinations, and 64 dual port memories DPA1-DPA64, each having one input and one output. For example, the first storage unit may include a third switch SWC switching between 32 output destinations, and include 32 memories DPD1-DPD32, each having 2 inputs and 2 outputs.

Furthermore, the second storage unit in the first and second embodiments of the present invention includes, but not limited to, a second switch SWB switching between 60 output destinations, and 60 dual port memories DPB1-DPB62, each having one input and one output. For example, the second storage unit may include a fourth switch SWD switching between 30 input destinations, and include 30 memories DPE1-DPE30, each having 2 inputs and 2 outputs.

(3) Likelihood Calculator

The embodiments of the present invention include, but not limited to, N likelihood calculators 10-1 to 10-N provided at the succeeding stage of the S/P converter. One likelihood calculator may be provided at the preceding stage of the S/P converter.

(4) Number of Bits of Each Input Data and Each Output Data of Decoder

The embodiments of the present invention have, but not limited to, data of 3 bits (multiple level data) input to the decoder and data of one bit (binary data) output from the decoder.

For example, in the case where data of 1 bit (binary data) is to be input to the decoder, data of 1 bit is to be transferred through each first signal line. Similarly, in the case where data of 3 bits (multiple level data) is to be output from the decoder, the data of 3 bits is to be transferred through each second signal line.

Although the present invention has been described and illustrated in detail, it is clearly understood that the same is by way of illustration and example only and is not to be taken by way of limitation, the scope of the present invention being interpreted only by the terms of the appended claims.

What is claimed is:

1. An error correcting decoding apparatus for performing decoding in units of code length N, comprising:
   a first storage unit for storing N input data constituting a code with a code length N;
   a decoder; and
   B1 first lines connecting the first storage unit with the decoder, where B1 is a natural number of at least 2 and less than the code length N, wherein:
   the first storage unit provides the stored N input data constituting a code with a code length N to the decoder through the B1 first lines dividedly over several times,
   a parallel number of input data provided in each time is up to B1,
   the decoder decodes the N input data constituting a code with a code length N, which are provided from the first storage unit, in parallel.

2. The error correcting decoding apparatus according to claim 1, wherein:
   the first storage unit includes B1 dual port memories, each having one input and one output,
   the B1 dual port memories store the N input data constituting a code with a code length N, and
   the B1 dual port memories and the B1 first lines are connected in a one-to-one correspondence.

3. The error correcting decoding apparatus according to claim 1, wherein:
   the first storage unit includes B1 dual port memories, each having one input and one output,
   each dual port memory stores in duplication the N input data constituting a code with a code length N,
   the B1 dual port memories and the B1 first lines are connected in a one-to-one correspondence, and
   each dual port memory outputs data among the N input data constituting a code with a code length N, differing from each other.

4. The error correcting decoding apparatus according to claim 1, wherein B1 is a common divisor of the code length N.

5. A method of receiving input data by a decoder included in an error correcting decoding apparatus,
   wherein the decoder is configured to decode N input data constituting a code with a code length N in parallel, B1 first lines are connected to the decoder, through which the decoder receives the input data, and B1 is a natural number of at least 2 and less than the code length N,
   the method comprising:
   receiving, by the decoder, the N input data constituting a code with a code length N through the B1 first lines dividedly over several times; and
   decoding the N input data in parallel,
   wherein a parallel number of input data received in each time is up to B1.

* * * * *